US012631692B2

(12) United States Patent
Farrow et al.

(10) Patent No.: US 12,631,692 B2
(45) Date of Patent: May 19, 2026

(54) SERIAL HANDLING AND TESTING OF ELECTRICAL COMPONENTS

(71) Applicant: ATS Industrial Automation Inc., Cambridge (CA)

(72) Inventors: Gregory John Farrow, Cambridge (CA); Andrew David Boyle, Cambridge (CA); Kenneth Mark Johannesson, Cambridge (CA)

( * ) Notice: Subject to any disclaimer, the term of this patent is extended or adjusted under 35 U.S.C. 154(b) by 151 days.

(21) Appl. No.: 18/119,644

(22) Filed: Mar. 9, 2023

(65) Prior Publication Data

US 2023/0400529 A1 Dec. 14, 2023

Related U.S. Application Data

(60) Provisional application No. 63/319,948, filed on Mar. 15, 2022.

(51) Int. Cl.
*G01R 31/396* (2019.01)
*G01R 31/36* (2020.01)
*H01M 10/42* (2006.01)

(52) U.S. Cl.
CPC ....... *G01R 31/396* (2019.01); *G01R 31/3644* (2013.01); *H01M 10/4285* (2013.01)

(58) Field of Classification Search
CPC ............. G01R 31/3644; G01R 31/396; H01M 10/4285
See application file for complete search history.

(56) References Cited

U.S. PATENT DOCUMENTS

2013/0175206 A1* 7/2013 Li ........................... B07C 5/344
                                                              209/575
2013/0317639 A1* 11/2013 Choi .................... G01R 31/386
                                                              700/109
2021/0257648 A1* 8/2021 Jeung .................. H01M 50/213

* cited by examiner

*Primary Examiner* — Lee E Rodak
*Assistant Examiner* — Taqi R Nasir

(57) ABSTRACT

A robotic system for manipulating an electrical component between a first location and a second location, the system comprising: a movement element for moving a manipulation tool between the first location and the second location; the manipulation tool having one or more gripping elements for engaging the electrical component by grabbing the electrical component at the first location when the manipulation tool is positioned adjacent to the electrical component; and a testing system for implementing an electronic test of the electrical component while the electrical component is engaged by the manipulation tool, the testing system implementing the electronic test before the manipulation tool releases the electrical component; wherein upon reaching the second location the manipulation tool disengages with the electrical component, thereby reversing said engaging.

18 Claims, 14 Drawing Sheets

Approx. diameter
18.00 mm

32

34

16

Internal space
Approx.
5.00 mm

38

22

Approx. length
65.00 mm

30

39

Void diameter
Approx.
1.00 mm

Technical:
Length – 65.00 ± 0.25 mm
Diameter – 18.00 ± 0.41 mm slot 76

73

Sleeve 72

Sensor arrangement 62

Pick Tooling 40a

Cell Barcode 22

Barcode Scanner 40b

50a

40a bias 75

50b

Electrical Contact Probes 59

Cell Gripper Finger 50

52

Cell Ejector Pin 58

Cell Support Sleeve 72

32

Body 30

34

40a

Support
Sleeve 72

Module
Housing 12

Adjacent
receptacle 16

16b

63

62

Sensor Flag 64 Fully Lowered

Cell Ejector 58 Fully Lowered

61

63

62

Sensor Flag 64
Fully raised

Cell Ejector 58
Fully raised

16

SERIAL HANDLING AND TESTING OF ELECTRICAL COMPONENTS

TECHNICAL FIELD

The present invention relates to the technical field of testing and handling of electrical components and more particularly to fuel cell batteries.

BACKGROUND

Current EV battery assembly includes taking a standard battery cell, and assembling it into (i.e. "populating") a EV battery module, which is basically an inter-connection of multiple cells in order to achieve the overall voltage and energy requirements for the EV battery. It is common in the EV cell testing and assembly environment to employ robots to pick up and place a collection of EV battery cells from a shipping container to various adjacent stations, such as a testing station used to confirm that each EV cell meets manufacturing standards (e.g. defined cell voltage, defined cell amperage, etc.). These pick up and place operations on the individual battery cells are done prior to populating the battery module with the gathered and tested cells. As such, current techniques for picking up and placing cells (e.g. for transferring from one location to another, including testing/validating) can include testing/measuring cell voltage, reading of bar codes positioning on an exterior surface of each EV cell, and generally verifying individual EV cells prior to populating the battery module. It is recognized that current pick and place systems utilize equipment to pick up multiple EV battery cells at the same time, which can be disadvantageous in programming of the robotic system in the event of changes to the dimensions of the EV battery cell itself (e.g. for different cell types, and different cell positions within the battery module). "Battery Cell" typically refers to the "cell" itself and not the completed battery with multiple cells which is known as the "cell module".

Further, organization in a shipping container (e.g. loosely held in a grouping) and/or different configurations of module blocks (e.g. different/variable spacing of cell receptacles in relation to one another) can make engagement problematic with multiple EV cells at once. A further disadvantage of current systems is that vacuum systems are used to pick up the particular EV battery cells, which may not provide for stable engagement with the EV cells by the vacuum system (i.e. a tendency to prematurely let go) during accelerated travel of the robot between locations, or loss of vacuum during automation machine stoppage for maintenance or other. Further the requirement of current systems to pick up and place multiple times between the shipping container and the eventual disposal bin (or battery module assembly) can affect throughput of the system when assembling the battery module assemblies.

Unfortunately, some further disadvantages of current pick and place automated operations include: inflexibility (e.g. not being able to accommodate different types of cells and their spatial positioning with respect to one another); a requirement to pick up and place multiple times per EV cell, during the process from original shipping container through to testing and eventual assembly in the EV battery module; and later (i.e. further downstream) and less-accurate fault rejects. For example, currently, when a faulty assembled battery module is detected at the end of the assembly line, it can cost about $15 k, so enabling earlier EV cell testing as well as streamlining the pick and place operations for each EV cell can realize substantial savings in the EV battery module assembly process. Further, desired is a more comprehensive fault detection on individual cells, which may also produce substantial savings.

SUMMARY

An object of the present invention is to provide an electrical component pick and place system and method to obviate or mitigate at least one of the above-presented disadvantages.

An aspect provided is a robotic system for manipulating an electrical component between a first location and a second location, the system comprising: a movement element for moving a manipulation tool between the first location and the second location; the manipulation tool having one or more gripping elements for engaging the electrical component by grabbing the electrical component at the first location when the manipulation tool is positioned adjacent to the electrical component; and a testing system for implementing an electronic test of the electrical component while the electrical component is engaged by the manipulation tool, the testing system implementing the electronic test before the manipulation tool releases the electrical component; wherein upon reaching the second location the manipulation tool disengages with the electrical component, thereby reversing said engaging.

A second aspect provided is a method for using a robotic system to manipulate an electrical component between a first location and a second location, the method comprising: engaging the electrical component by a manipulation tool having one or more gripping elements, the electrical component grabbed by the manipulation tool at the first location when the manipulation tool is positioned adjacent to the electrical component; translating the manipulation tool by a movement element between the first location and the second location; implementing an electronic test of the electrical component while the electrical component is engaged by the manipulation tool but before releasing the electrical component; and disengaging the manipulation tool with the electrical component upon reaching the second location, thereby reversing said engaging.

A further aspect provided is the robotic system comprising reading a unique ID of the electrical component by rotating the electrical component once retained by the one or more gripping elements; wherein the electrical component is rotated when the manipulation tool is between the first location and the second location; wherein rotation is about an axis of the electrical component.

DETAILED DESCRIPTION

To make the technical issues to be addressed, the technical solutions adopted and the technical effects achieved more clear, the technical solutions are further described hereinafter through embodiments in conjunction with drawings. It is to be understood that the embodiments set forth below are intended to illustrate rather than limiting.

In the description, unless otherwise expressly specified and limited, the terms "mounted", "connected", or "coupled" are to be construed in a broad sense, for example, as permanently connected, detachably connected, or integrated; mechanically connected or electrically connected; directly connected to each other or indirectly connected to each other via an intermediary; or internally connection of two components or interaction between two components. For those of ordinary skill in the art, specific meanings of the preceding terms in the present utility model may be construed based on specific situations.

Generally, EV battery assembly includes taking a standard battery cell (e.g. EV battery), and assembling it into (i.e. "populating") a battery module, which is essentially an inter-connection of multiple cells in order to achieve the overall voltage and energy requirements for the EV battery. In this particular pick and place system, as further described below, used is a robot pick-and-place technique on individual battery cells, with further testing of the EV cell parameters (e.g. voltage, current, etc.) during movement from one location to another location, i.e. the testing is performed while in transit between locations while the EV cell is held by the pick and place robotic system. As such, the pick and place robotic system can be used to perform advanced sorting (e.g. prior to populating the battery module by the EV cell). This advanced sorting/processing can include testing/measuring individual cell voltage, reading a bar code, and generally verifying individual cells prior to populating the battery module. Some advantages of the pick and place robotic system include increased flexibility (e.g. accommodating different types of cells in a straight forward way due to serial pick up and place nature of individual cells, as well as facilitating earlier and more-accurate fault rejects.

Figure 1:
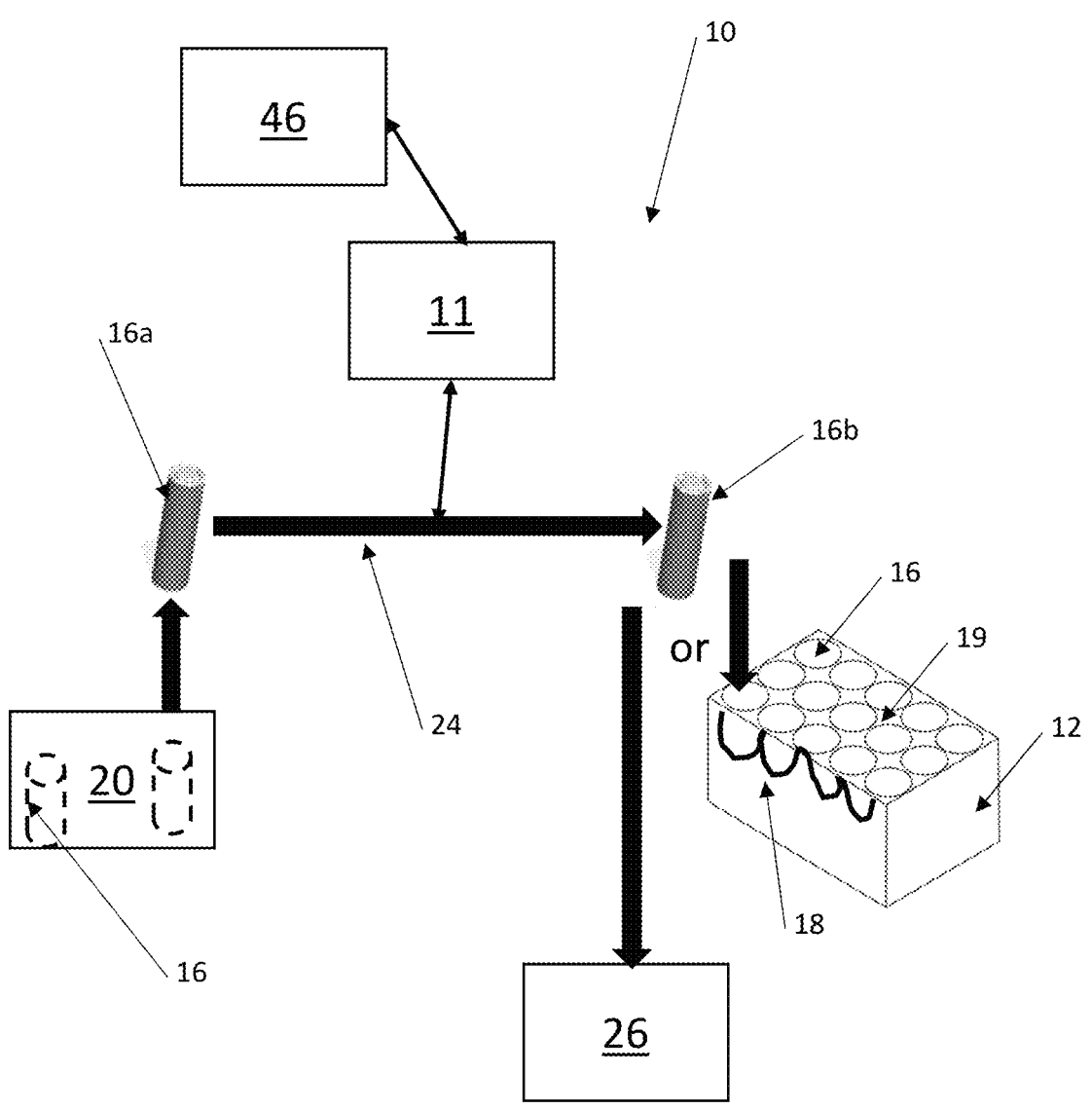
FIG. 1 is a schematic view of a pick and place robotic system for an electrical component.

Further, it is recognized that preferably the robotic system 11 picks up and places one EV battery cell 16 at a time, in a serial fashion, between a shipping container and a block 12 or bin 26, see FIG. 1.

Figure 2:
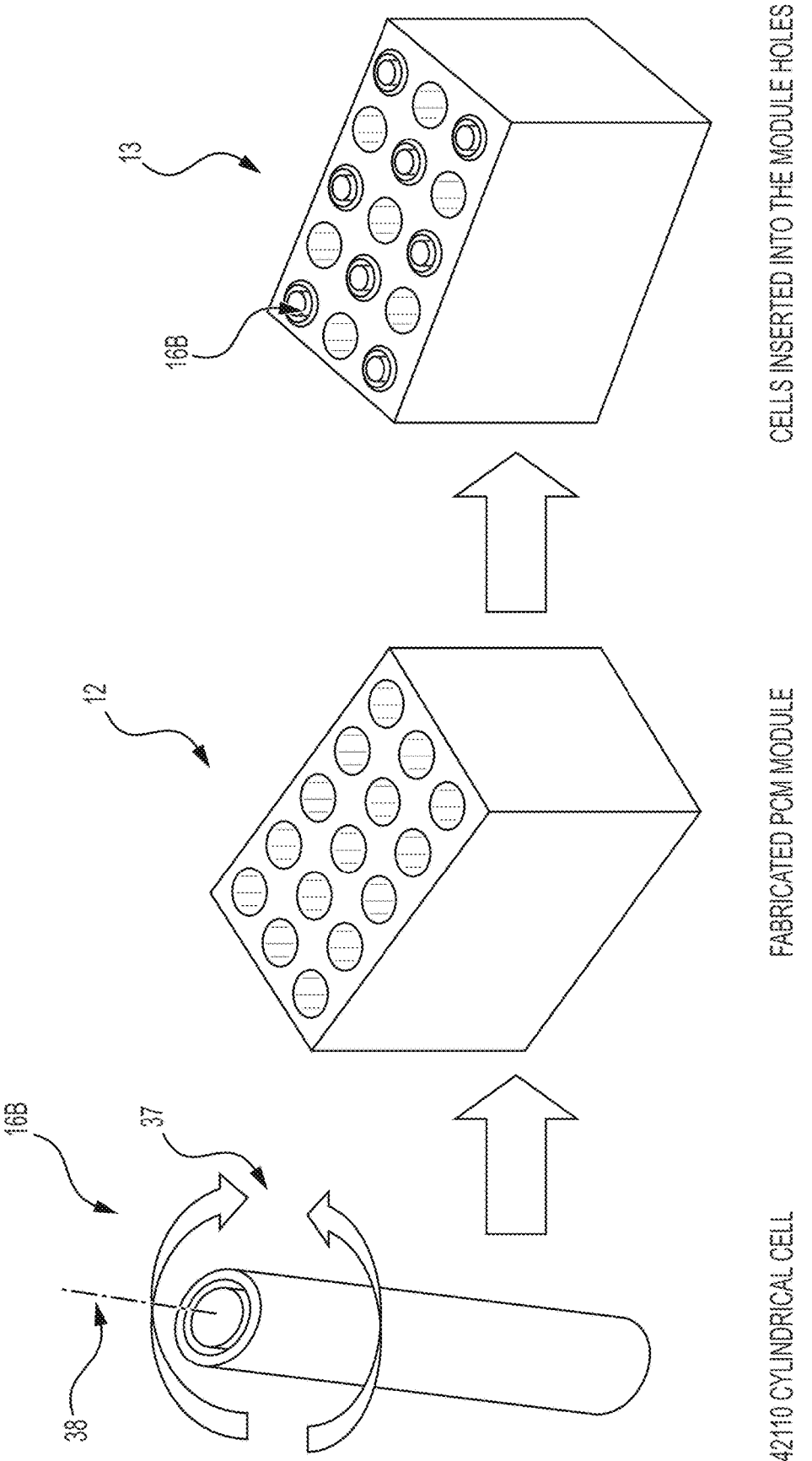
FIG. 2 is an example operation of the robotic system of FIG. 1.

Referring again to FIG. 1, shown is a block diagram of system components of a pick and place system 10, including the robot system 11, as well as an example context of the system 10 in its operating environment for assembly of an EV battery block 12, represented as a collection of inter-connected EV battery cell receptacles 16 electrically inter-connected 18 to one another in a matrix 19, which thereby contributes to overall voltage and energy requirements for the EV battery module 13, once the receptacles 16 are populated with tested EV cells 16*b*, to result in an assembled module 13 (see FIG. 2). Further, the individual EV battery cells 16 first arrive adjacent to the robotic system 11 (e.g. on a conveyor belt system—not shown) in a shipping container 20 (containing a plurality of untested EV battery cells 16*a*, also referred to as a first location), after which the robotic system 10 is responsible for serially grabbing 24 each untested EV cell 16*a* out of the container 20, performing a test on the EV battery cell attributes (e.g. voltage, amperage, etc.), determining an identification of a unique ID 22 of the EV cell 16*a* (e.g. by reading of a barcode 22 positioned on a side of the EV cell 16*a*—see FIG. 3), and then continuing movement of the now tested EV cell 16*b* to either 1) the battery block 12 and inserting the now tested EV cell 16*b* therein (in the case where the tested EV battery cell 16*b* passed the testing) or discarding the now tested EV cell 16*b* (in the case where the tested EV battery cell 16*b* failed the testing) into a discard area 26 (e.g. a recycling bin), both of which are also referred to as a second location or a third location. It is recognized that the EV cell 16, 16*a*, 16*b* can be referred to as a generic electrical component, such that the described system 10 could be used to pick and place, with in transit testing, for types of electrical components other than specifically EV battery cells 16.

Figure 3:
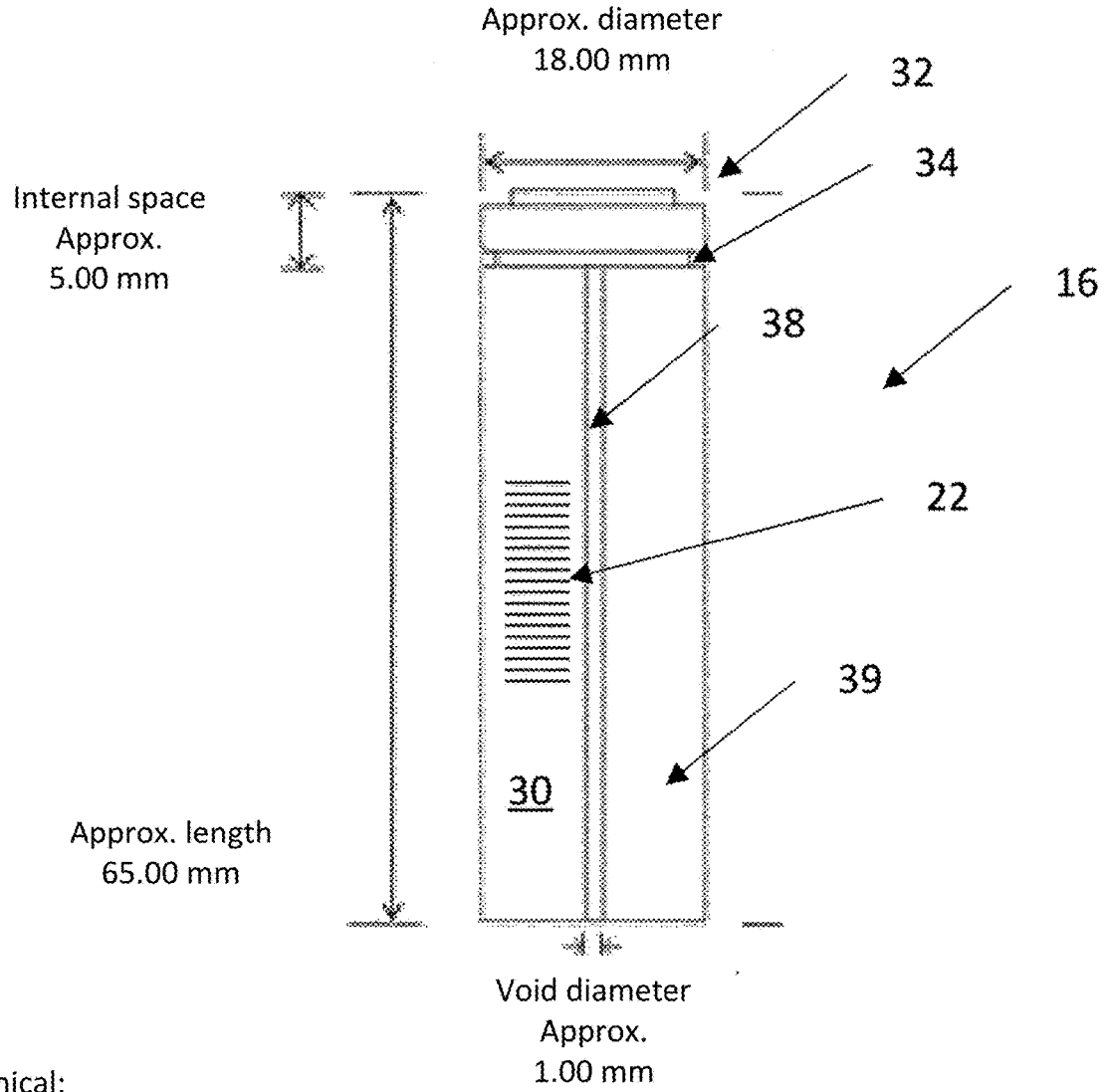
FIG. 3 is side view of an example electrical component of FIG. 1.

Referring to FIG. 3, each EV battery cell 16 can have a body 30 with a conductive portion (e.g. end) 32. Adjacent to the conductive end 32 is a physical feature 34 in the body 30, such as a groove, for use by the robot system 11 in picking up the EV battery cell 16 from the shipping container 20. It is recognized that the geometry of the physical feature 34 is dependent upon the specific configuration of the electrical component 16 (e.g. EV battery cell 16). For example, other than shown the physical feature 34 can be a slot in the body 30, a protrusion from the body, etc. In any event, a manipulation tool 40 (e.g. end of arm tool—see FIG. 4) of the robot system 11 is configured to be positioned adjacent to the physical feature 34 and mechanically engage/couple with the physical feature 34 in order to releasably secure the EV battery cell 16 to the manipulation tool 40, as further described below by example.

Figure 4:
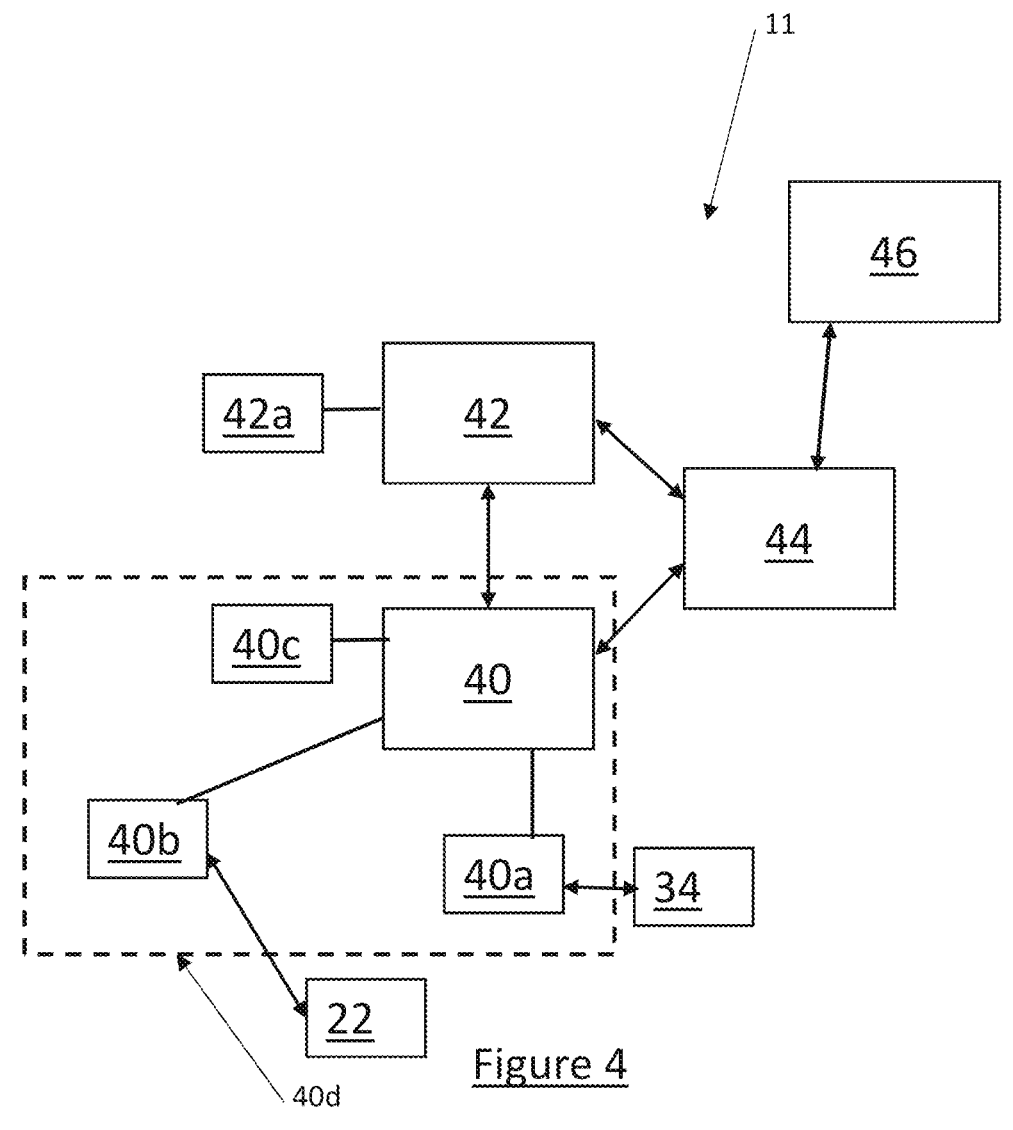
FIG. 4 is block diagram of an example embodiment of the system of FIG. 1.
Figure 7:
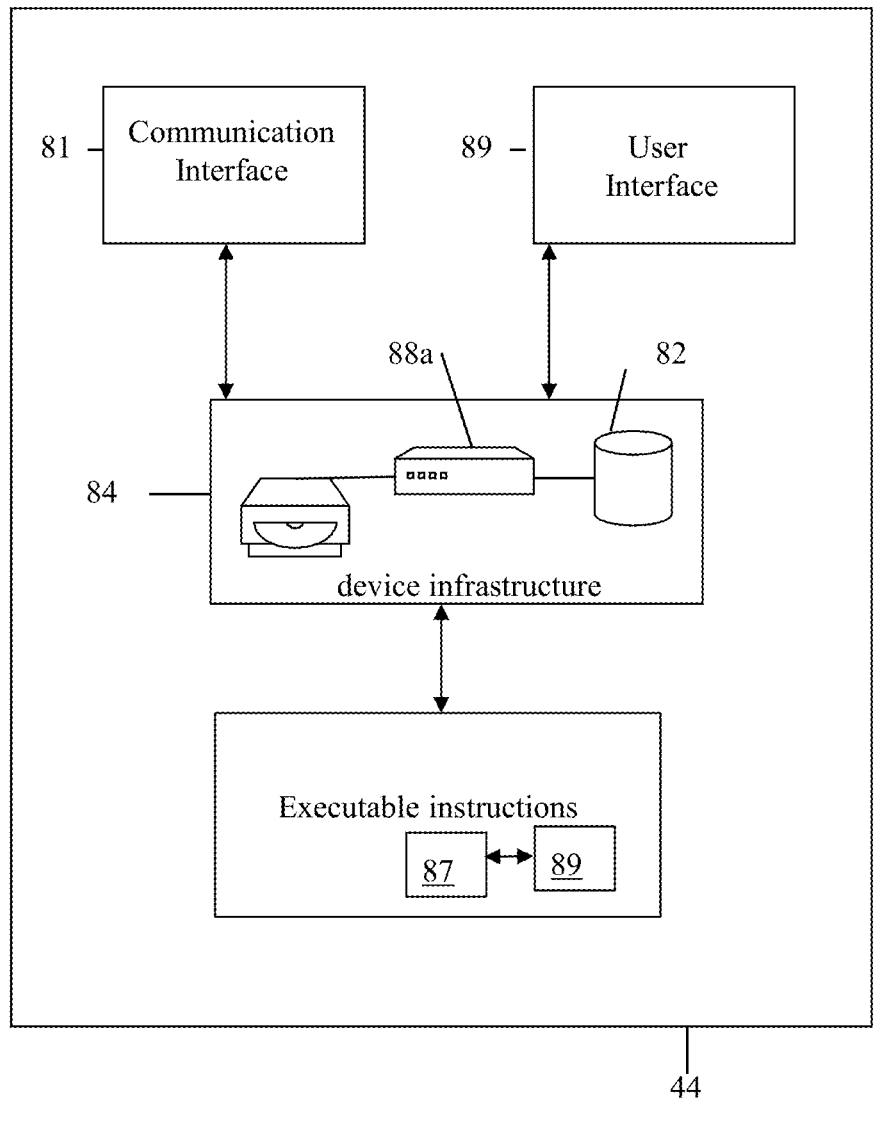
FIG. 7 is an example controller of FIG. 1.

Referring to FIG. 4, shown is an example block diagram of system components of the robot system 11, including such as but not limited to the manipulation tool 40 coupled to a moveable member 42 (e.g. one or more articulated arms connected to a controller 44 (e.g. an electronic system 54 having actuators 50, memory 52 and computer processors 58—see FIG. 7). For example, the manipulation tool 40 can be specifically designed to engage with the physical feature 34 of the EV battery cell 16, having an appropriate dimensioned gripping mechanism 40*a* to accommodate the defined dimensions of the EV cell battery 16 (see FIG. 3 by example). It is recognized that the manipulation tool 40 can also be releasably coupled to the moveable member 42, such that differently configured manipulation tools 40 can be provided for the robot system 11, in order to handle differently configured EV battery cells 16, as desired.

Figure 9:
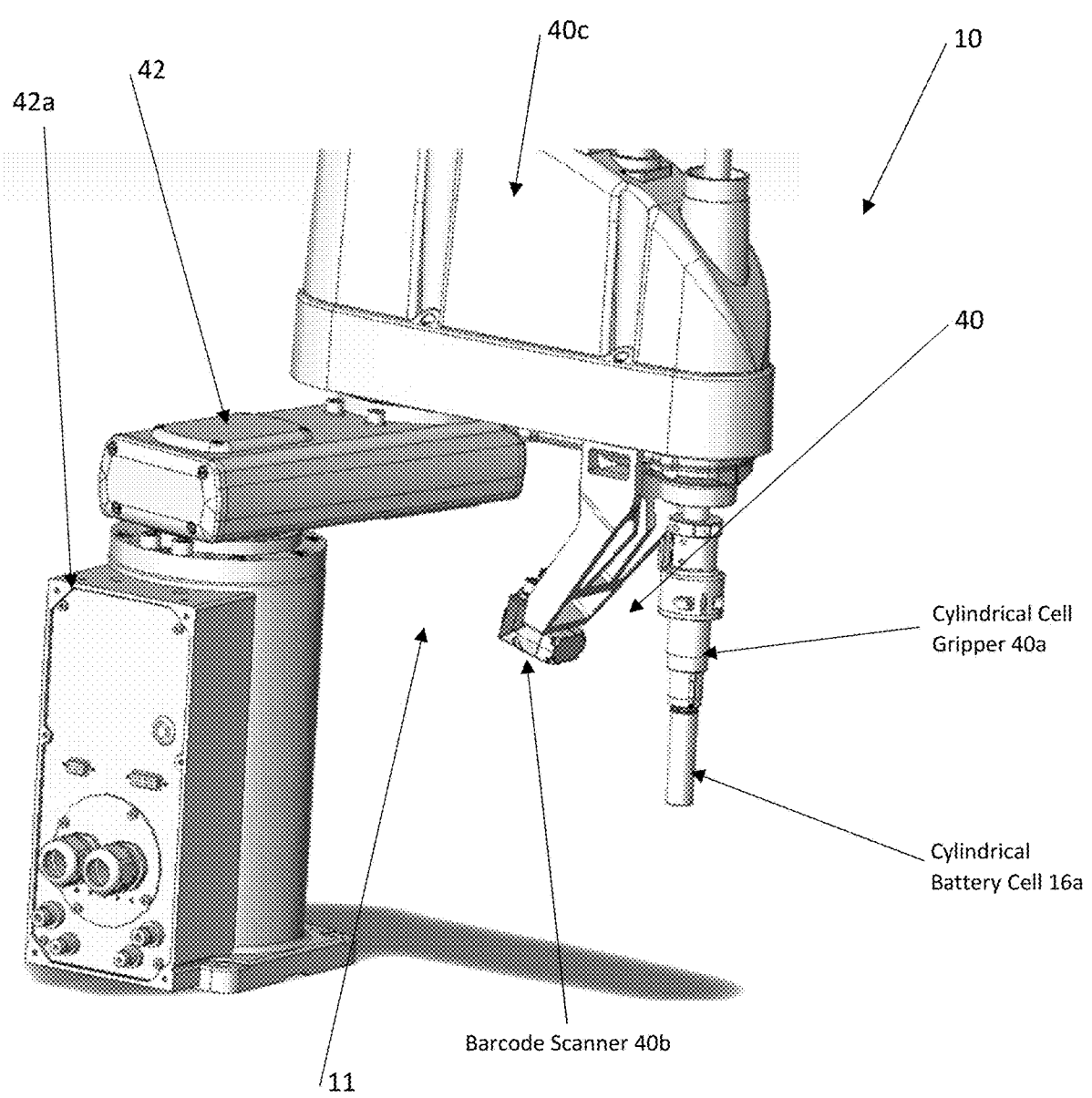
FIG. 9 shows an example embodiment of the robotic system of FIG. 1.

Further, referring to FIGS. 4 and 9, the robotic system 11 can have an optional reader system 40*b*, for example coupled to the manipulation tool 40, such that the reader system 40*b* can detect the unique ID 22 positioned on the body 22 of the EV battery cell 16. The manipulation tool 40 also has an optional actuator system 40*c* (e.g. one or more motors) providing for optional rotation 37 (e.g. rotational actuation) of the gripping mechanism 40*a* about a longitudinal axis 38 of the EV battery cell 16 (see FIGS. 2, 3). As such, the actuator system 40*c* can be utilized by the manipulation tool to rotate the body 30 of the EV battery cell 16, such that the unique ID is determined (i.e. read/scanned) by the reader system 40*b* (e.g. a bar code scanner). The actuator system 40*c* can also have one or more motors providing for translational actuation, which can be used to facilitate pick up of the EV battery cell 16 from the container 20 by the gripping mechanism 40*a* and/or release the EV battery cell 16 from the gripping mechanism 40*a* into the module 13 (or bin 26), see FIG. 1. It is also recognized that the moveable member 42 (e.g. one or more articulated arms) would be associated with an actuation system 42*a* from translating the gripping tool 40 into and out of the container 20 (in order to grab a selected EV battery cell 16*a* therefrom) as well as to move the grabbed EV battery cell 16*a* from the container 20 to either the module 12 or the bin 26 (see FIG. 1). As such, it is recognized that the actuation system(s) 40*c*, 42*a* involving translational actuation can be used by the robotic system 11 to manipulate the EV battery cell 16 out of the container 20 and eventually into either the block 12 or bin 26.

It is recognized that the system 10 can have a vision system 46 (e.g. a visual detection system) calibrated to detect: the presence of the container 20 as well as any defined zones therein; and the presence of the block 12 as well as the individual receptacles 16 therein. In this manner, the vision system 46 can be used as an input to the control system 44 in order to optimize the selection of the EV battery cells 16*a* and subsequent placement/release of the EV battery cells 16*b*, as the control system 44 picks up, tests and puts down each EV cell as is translated from the container 20 to either the block 12 or bin 26.

Figure 5:
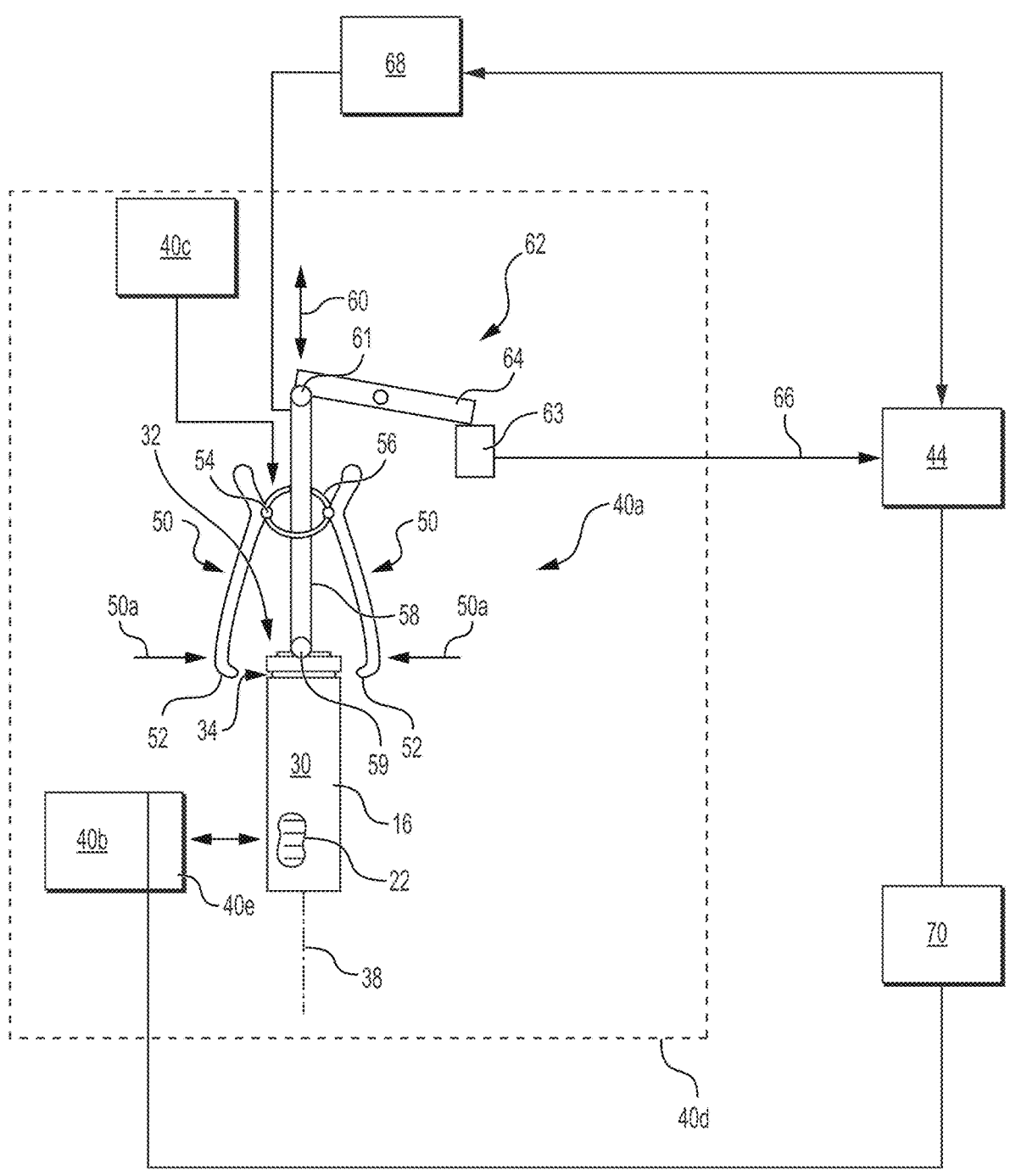
FIG. 5 is an embodiment of a manipulation tool of the system of FIG. 1.

Referring to FIG. 5, shown is cross sectional view of an example embodiment of the gripping mechanism 40*a*, such that the gripping mechanism 40*a* has one or more gripping elements 50 (e.g. arms) for engaging gripping portions 52 (e.g. hooks) with the physical feature 34 (e.g. groove) located in the body 30 of the EV battery cell 16. The gripping elements 50 can be moveable (e.g. on pivots 54) on a body 56 of the actuator mechanism 40*c*, such that the actuator mechanism 40*c* can rotate the gripping element(s) 50 about the axis 38. For example, the gripping elements 50 can be actuated automatically by the actuation system 40*c* (or can be biased by resilient elements 50*a*) in order to engage the gripping portion(s) 52 with the physical feature 34, once the gripping portion(s) 54 are located adjacent to the physical feature 34 (e.g. due to translation of the manipulation tool 40 by the moveable element 42 under control of the controller 44). Alternatively, or in addition to, the gripping element(s) 50 can be biased (e.g. by one or more resilient elements 50*a*) into engagement with the physical feature 34 when in the proximity of the gripping portion(s) 52. It is also recognized that the resilient elements 50*a* could be one or more resilient portions of the gripping element(s) 50 themselves. The gripping elements 50 can be pivotable on pivots 50*b* (see FIG. 11).

Figure 11:
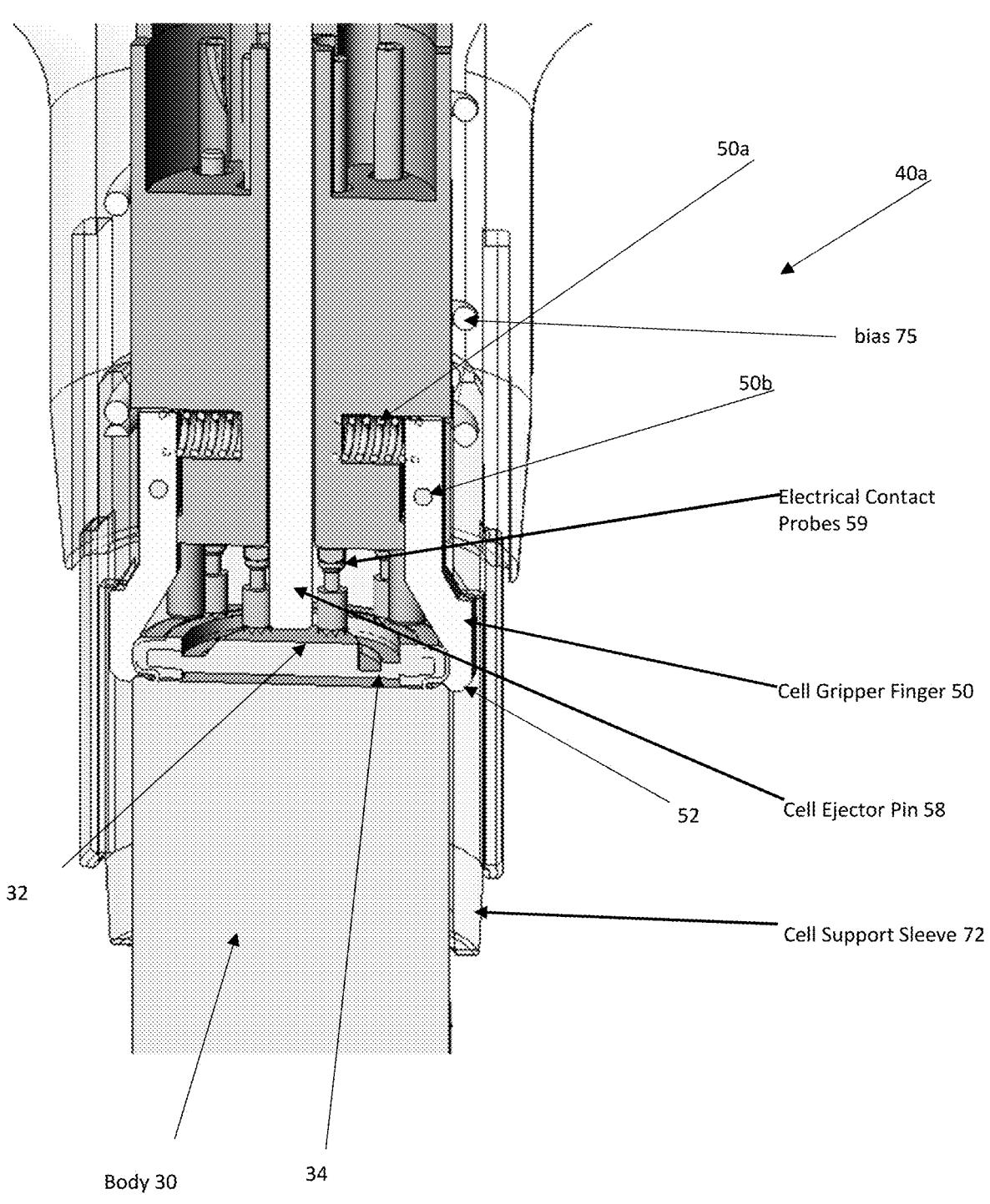
FIG. 11 shows a cross sectional view of an embodiment of the gripper tool of FIG. 5 engaged with a cell.
Figure 14:
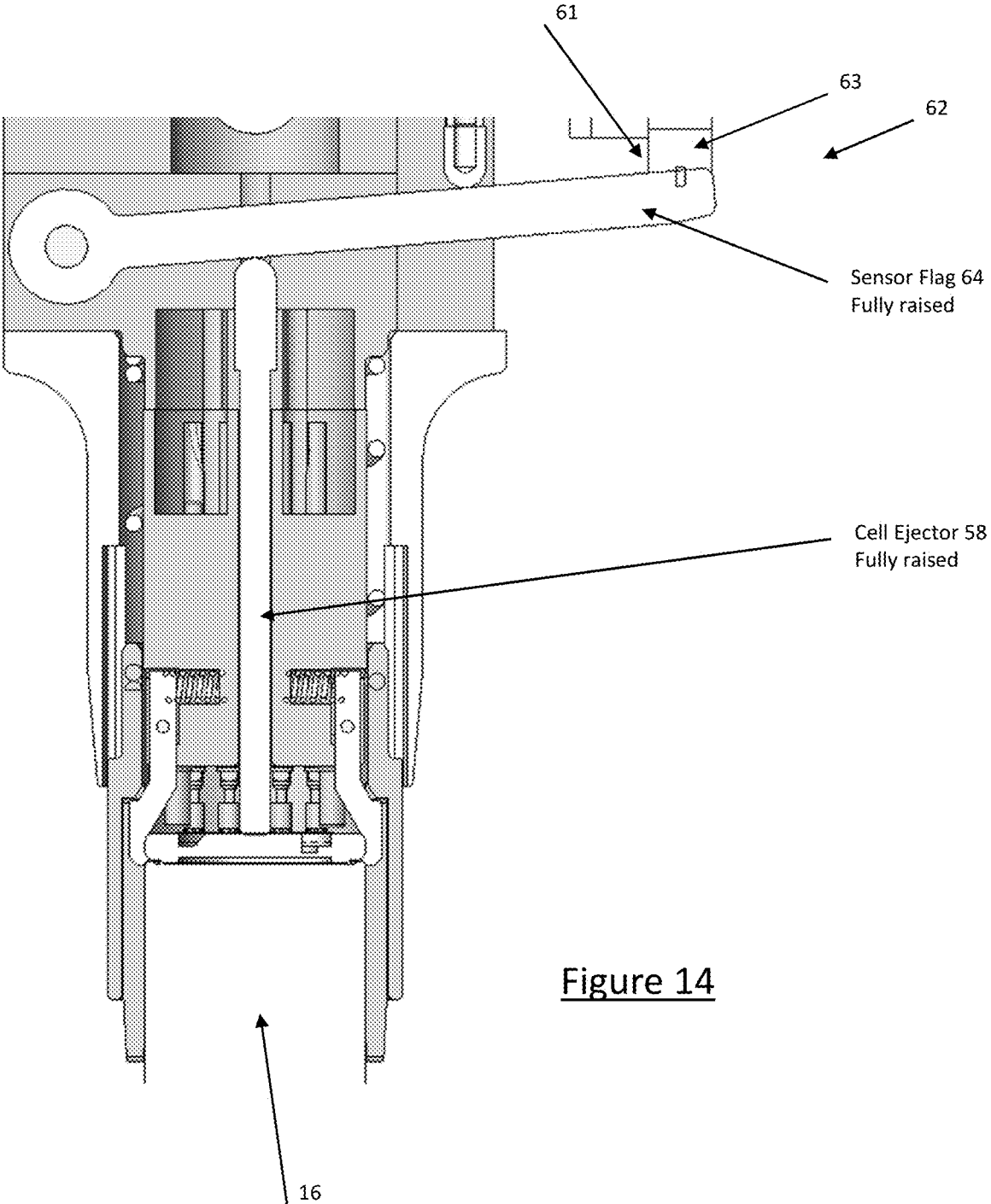
FIG. 14 shows a cross sectional view of the embodiment of the gripper tool of FIG. 11 engaged with a cell.

Also, the gripping mechanism 40*a* can have an indicator element 58 (e.g. a rod) for making contact 59 with the end 32 of the EV battery cell 16, see FIG. 11. For example, when the body 30 moves into proximity of the gripping element(s) 50, the indicator element 58 is translated 60 along the axis 38 towards a sensor arrangement 62, e.g. into contact 61 (see FIG. 14). For example, the sensor arrangement 62 can have a pivotable arm 64 for closing a sensor connection of a sensor 63 (e.g. mechanical sensor, proximity sensor, optical sensor, etc.). In any event, it is recognized that movement of the indicator element 58 into coupling with the sensor arrangement 62 can send a grab signal 66 to the controller 44, thereby indicating to the controller 44 that the gripping element(s) 50 have successfully engaged with the EV battery cell 16. Upon successful engagement, the controller 44 can operate under the impression that the gripping mechanism 40*a* has physical control of the EV battery cell 16. In other words, in the event that the indicator element 58 does not make contact with the sensor arrangement 62, then the controller 44 would consider that the griping element(s) 50 have not engaged with the EV battery cell 16 (i.e. the manipulation tool 40 has yet to gain, or has lost, physical control of the EV battery cell 16). Upon the desire to remove the EV battery cell 16 from the gripping element(s) 50, the actuator system 40*c* could actively translate 60 the indicator element 58 towards the EV battery cell 16, thus facilitating the dislodgement (e.g. decoupling/disengagement) between the gripping portion(s) 52 and the physical feature 34. Once disengaged, the EV battery cell 16 would be decoupled (e.g. released) by the manipulation tool 40. Indicator element 58 (also referred to as ejector pin 58) can be used to push the cell 16*b* out of contact with the gripping element(s) 50, once the testing is complete and the cell 16*b* is placed either in the block 12 or bin 26 (see FIG. 1).

Further, referring to FIGS. 4, 5, the manipulation tool 40 can have a tester element 59 (e.g. can be used as the indicator element 58 or as a separate element—shown by example as contact probes 59), such that the tester element 59 is electrically conductive and thus can be put into contact with the conductive portion 32 of the EV battery cell 16, once retained by the manipulation tool 40. For example, the tester element (e.g. element 59) can be couple to a tester circuit 68, as operated by the controller 44 to run diagnostic tests (e.g. voltage checks, current checks, etc.) with the EV battery cell 16, once retained by the manipulation tool 40. For example, when the signal 66 indicates that the EV battery cell 16 is retained by the gripping element(s) 50, then the testing circuit 68 can be operated by the controller 44 in order to send test signals (and receive test responses) to the EV battery cell 16 via the tester element (e.g. element 59).

Referring again to FIG. 5, the reader system 40*b* can detect the unique ID 22 positioned on the body 30 of the EV battery cell 16, as the actuation system 40*c* rotates the EV battery cell 16. For example, the reader system 40*b* can be positioned on a frame 40*d* of the manipulation tool 40, located adjacent to the position of the EV battery cell 16, such that a scanning portion (e.g. bar code reader 40*e*) is in line of sight of the ID 22 as the body 30 is rotated about the axis 38. Once the ID 22 is read, then the ID information 70 (e.g. cell serial number, batch umber, manufacturer, designated voltage, current values, etc.) can be sent to the controller 44 for use in the testing procedure of the tester circuit 68 operations and/or for communicating the information for use by other components of the system 10 during manufacture and subsequent usage of the assembled module 13 (for example to assist in auditing exercises in the event of a malfunction of the assembled module 13 during field operation, and for example to determine that each cell 16 in a battery pack 13 is from the same lot from the cell manufacturer). It is also recognized that the actuator system 40*c* can be mounted on the frame 40*d*, as could be the sensor arrangement 6 and the gripping mechanism 40*a*.

Figure 6:
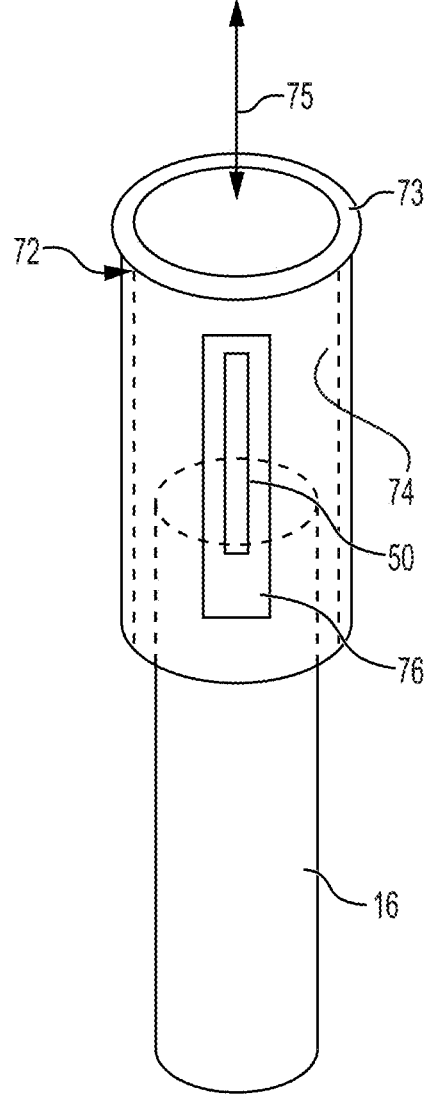
FIG. 6 is further embodiment of the manipulation tool of FIG. 5.
Figure 10:
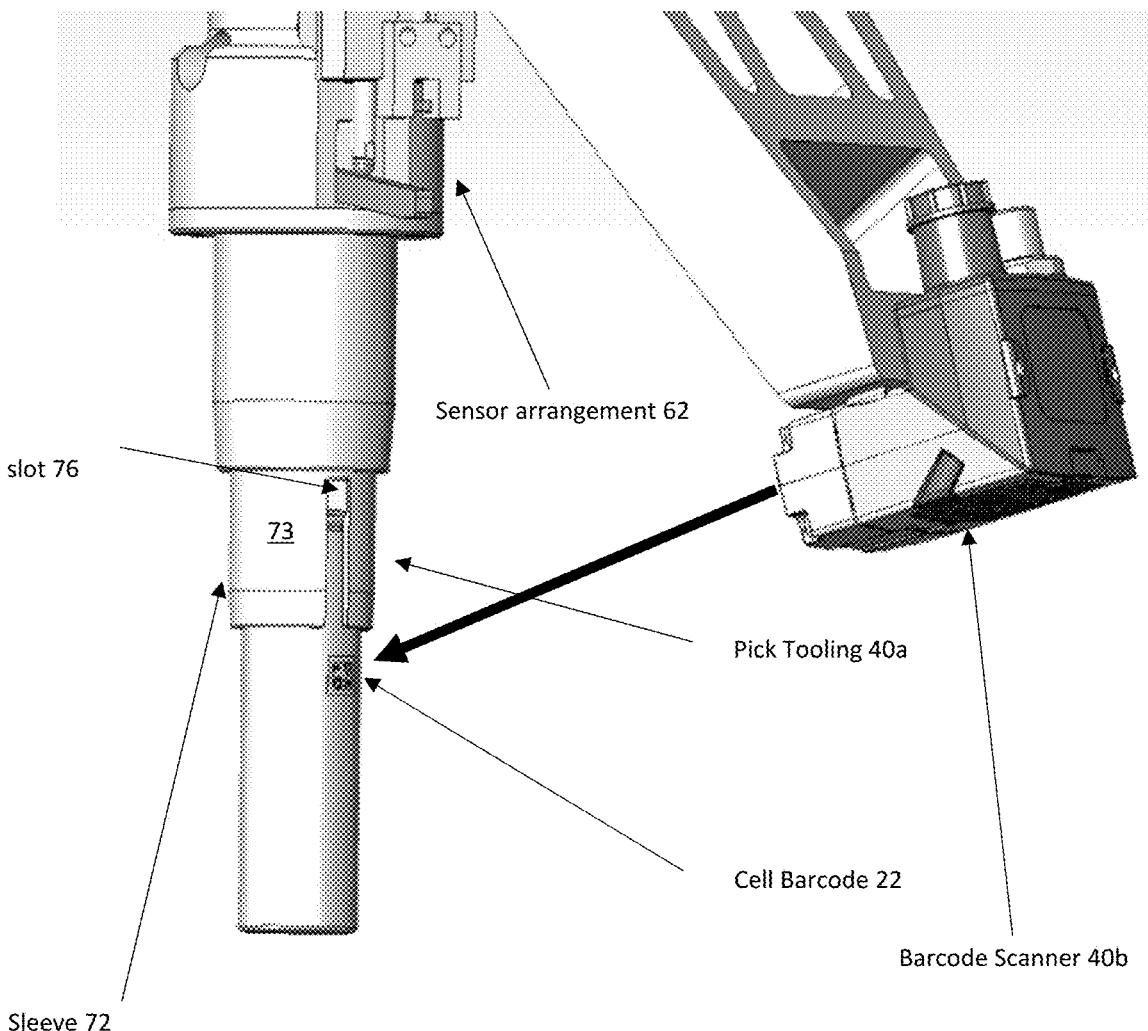
FIG. 10 shows a view of the embodiment of the robotic system of FIG. 9 with gripped cell.
Figure 12:
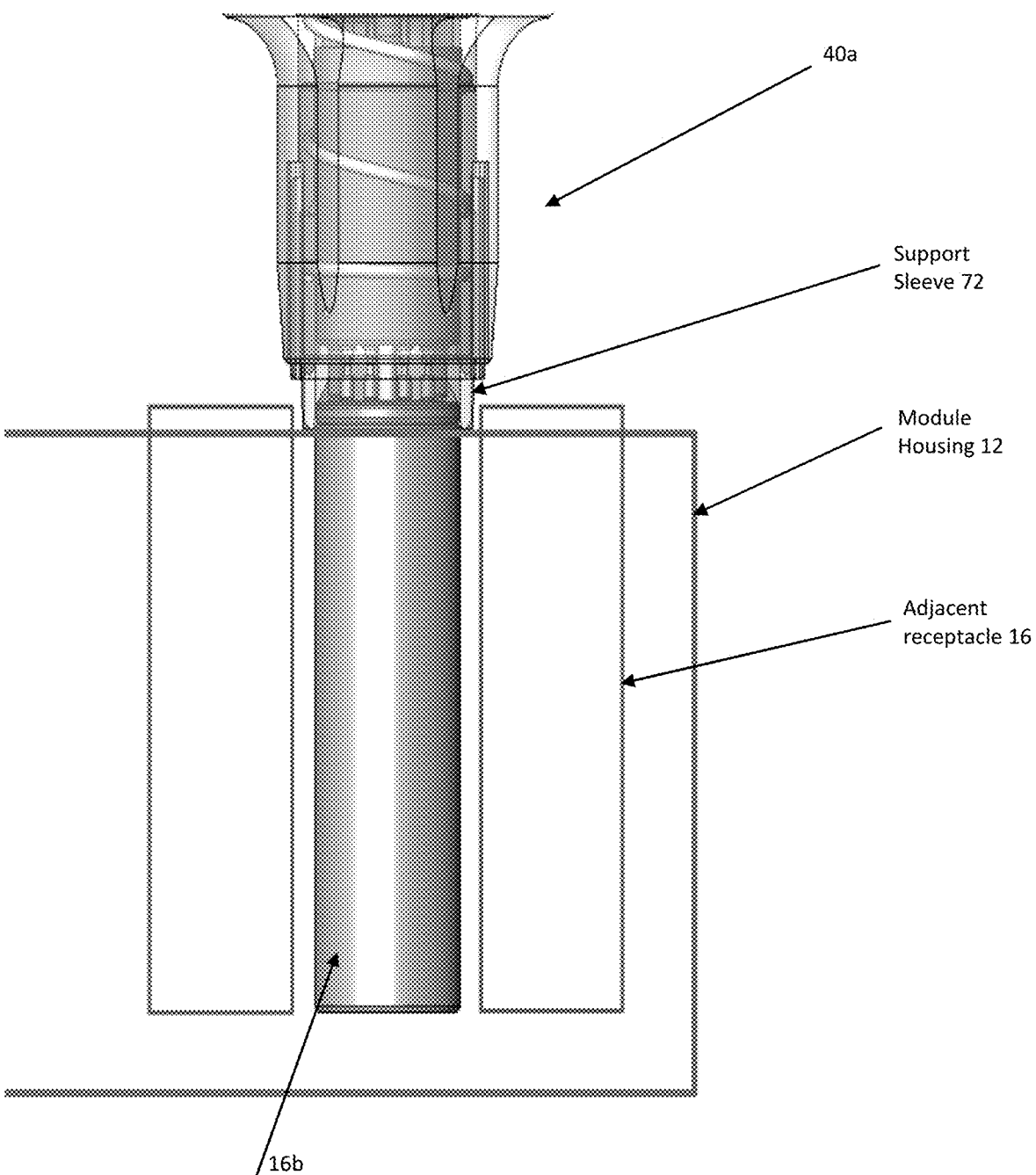
FIG. 12 shows the gripper tool of FIG. 11 depositing the tested cell in the battery block of FIG. 1.
Figure 13:
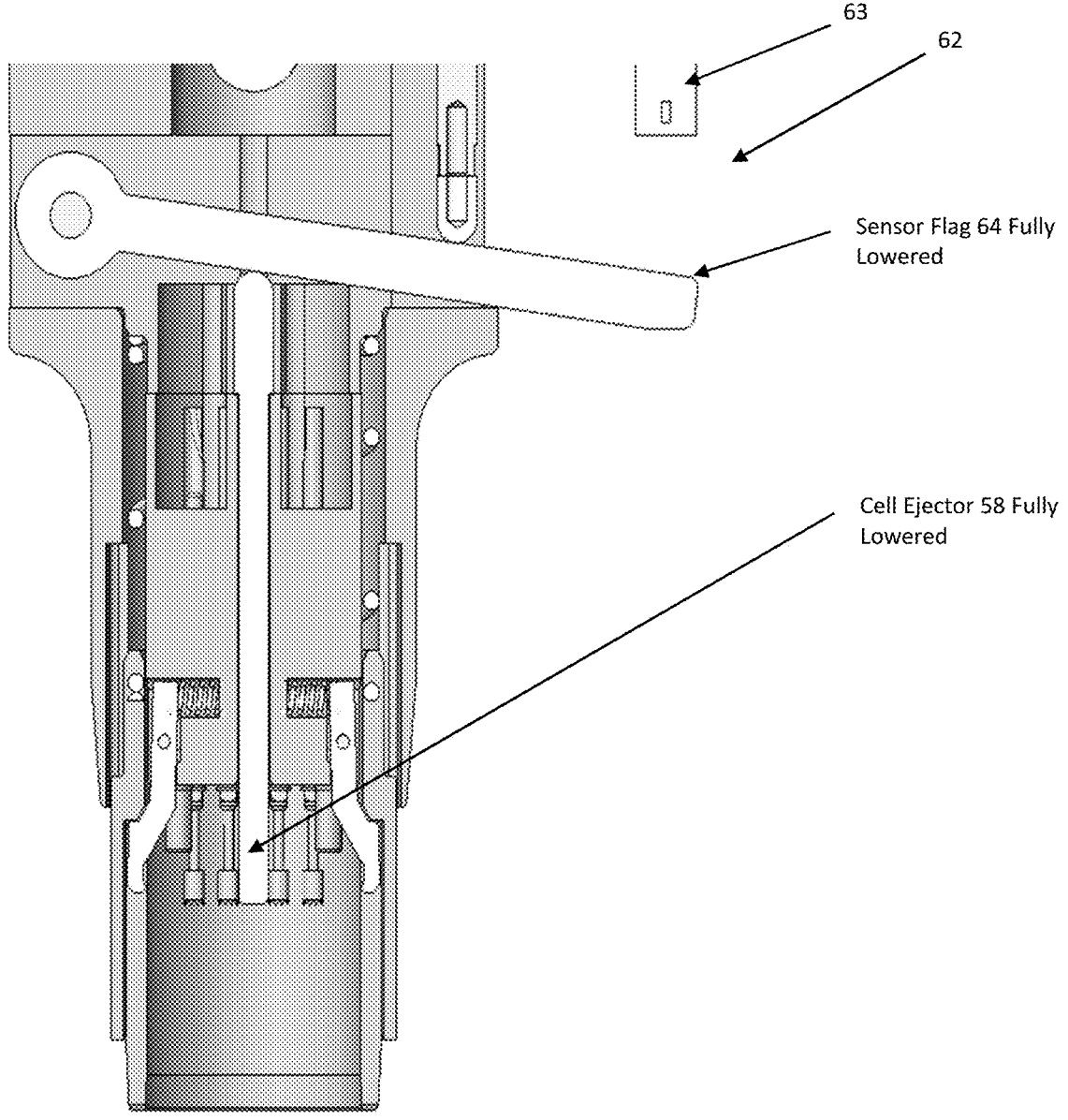
FIG. 13 shows a cross sectional view of the embodiment of the gripper tool of FIG. 11 disengaged with a cell.

Referring to FIGS. 5, 6, the gripping mechanism 40*a* could also have a sleeve 72 (see FIG. 10) for extending about at least a portion of the body 30, as the EV battery cell 16 is removed from the container 20. This sleeve 72, having a body 73, could be biased towards the EV battery cell 16, for example by a resilient element 75 (see FIG. 11), in order for the sleeve 72 to be manipulated between a retracted position (see FIG. 12 where the sleeve 72 is pushed up against the bias 75 by the block 12) and an extended position (shown in FIGS. 6, 11). As such, in the retracted position (e.g. due to the presence of the EV cell 16 having the end 32 adjacent to the bottom of the sleeve 72 and thus exposing the physical feature 34 to the gripping element(s) 50), the sleeve 72 minimal to no interfere with engagement of the gripping element(s) 50 with the physical feature 34. As such, when moved with the bias of resilient element 75, while in the extended position, the interior wall 74 of the sleeve overlaps the body 30 and thus inhibits lateral movement of the body 30 (with respect to the axis 38) when the manipulation tool 40a is translated (typically at high speed) between the container 20 and the module 13 or bin 26. Further, the sleeve 72 could have slot(s) 76 (see FIG. 10) in the body 73, accommodating appropriate room for the presence and manipulation of the gripping element(s) 50. As such, the tolerance (i.e. space) between the inner wall 74 and the body 30 can be configured to minimize any lateral movement as discussed above. For example, in the retracted position, the inner wall 74 would have little to no overlap with the body 30 (see FIG. 12). In other words, the overlap between the body 30 and the inner wall 74 is minimized in the retracted position and maximized in the extended position.

An advantage of using the sleeve 72 is to inhibit the cell 16 from being flung out of the gripping mechanism 40a during rapid movement between the container and the block 12 or bin 26. It is also recognized that a configuration of the gripping mechanism 40a can also instead accommodate for the function of the sleeve 72, e.g. hold the cell 16 more securely by itself (rather than as shown) and thus be able to substitute for any need for the sleeve 72, as desired. As such, depending upon the design of the gripping mechanism 40a, the presence of the sleeve 72 can be optional.

During testing, it has been found that because of minimal clearance between the cell body 30 outer diameter and the inside diameter of the sleeve 72, the cell body 16 can be slow to gravity drop out of the gripping mechanism 40a when ejected by rod 58. As such, it is recognized that a positive air pressure system could be incorporated in the gripping mechanism 40a in order to eject the cell 16 when the sleeve 72 is fully lowered for when the cell 16 is rejected due to testing or bad barcode and not placed into the battery block 12

Referring to FIG. 7, the control system 44 infrastructure 84 can includes one or more computer processors 88a and can include an associated memory 82. The computer processor 88a facilitates performance of the control system 44 configured for the intended task (e.g. of the respective operation of any of the systems 40, 42, 44, 46 as described) through operation of a communication interface 81, a user interface 89 and other application programs/hardware by executing task related instructions. These task related instructions 87 (e.g. associated with the operational parameters 90 such as location of the container 20, location of the bin 26, location of the block 12, as well as those parameters of the vision system 46 used to locate and guide individual the manipulation tool 40 to individual receptacles 16 and individual EV battery cells 16a in the container 20) can be provided by an operating system, and/or software applications located in the memory 82, and/or by operability that is configured into the electronic/digital circuitry of the processor(s) 88a designed to perform the specific task(s). Further, it is recognized that the device infrastructure 84 can include a computer readable storage medium coupled to the processor 88a for providing instructions to the processor 88a and/or to load/update the instructions 87. The computer readable medium can include hardware and/or software such as, by way of example only, magnetic disks, magnetic tape, optically readable medium such as CD/DVD ROMS, and memory cards. In each case, the computer readable medium may take the form of a small disk, floppy diskette, cassette, hard disk drive, solid-state memory card, or RAM provided in the memory module. It should be noted that the above listed example computer readable mediums can be used either alone or in combination.

Figure 8:
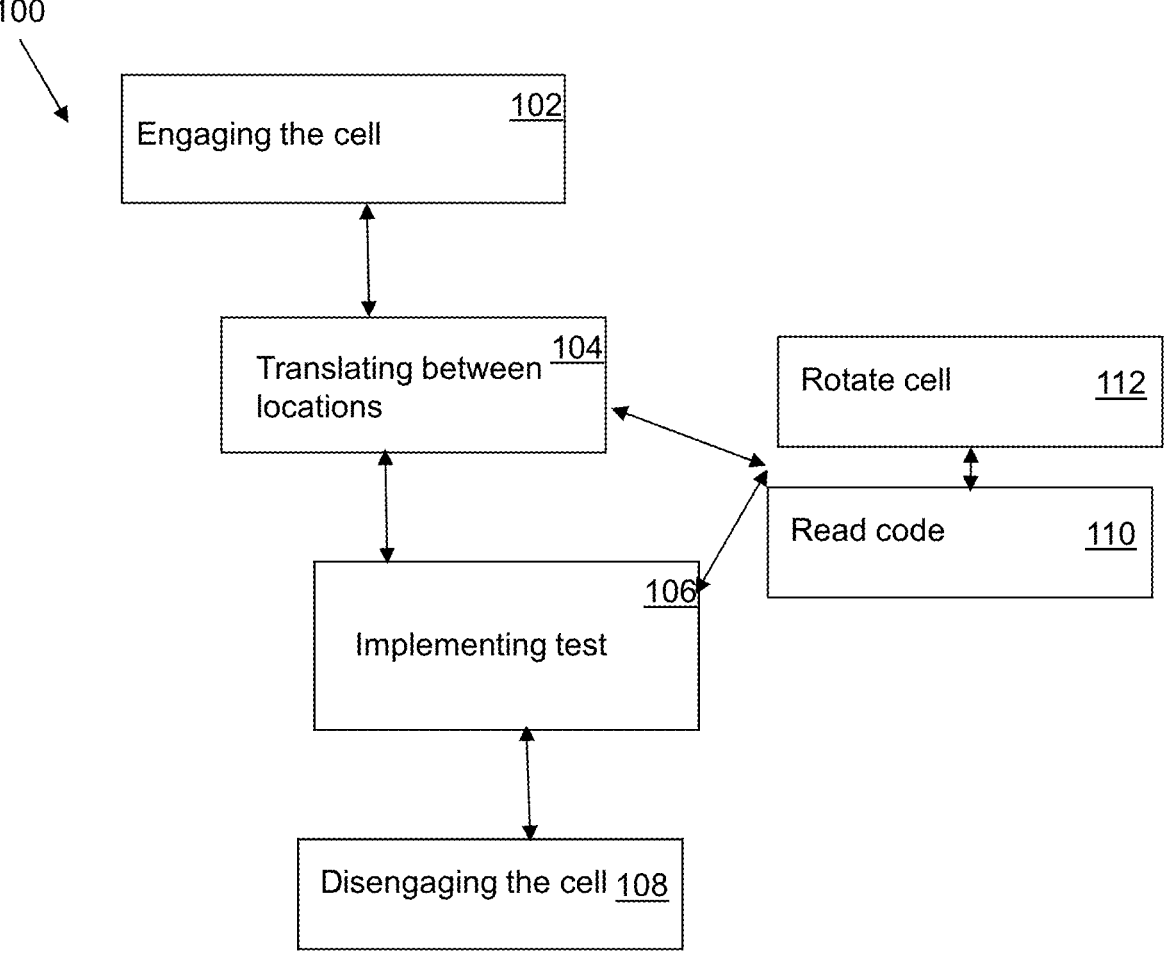
FIG. 8 is a block diagram of an example operation of the system of FIG. 1.

It is recognized that the device infrastructure 84 is utilized to execute the system(s) 40, 42, 44, 46, as desired, in order to implement the operation 100 of FIG. 8. Further, it is recognized that the control system 44 can include the executable applications comprising code or machine readable instructions 57 for implementing predetermined functions/operations including those of an operating system and the systems 40, 42, 46, for example. The processor 88a as used herein is a configured device and/or set of machine-readable instructions for performing operations as described by example above, including those operations as performed by any or all of the systems 40, 42, 44, 46. As used herein, the processor 88a can comprise any one or combination of, hardware, firmware, and/or software. The processor 88a acts upon information by manipulating, analyzing, modifying, converting or transmitting information for use by an executable procedure or an information device, and/or by routing the information with respect to an output device. The processor 88a can use or comprise the capabilities of a controller or microprocessor, for example. Accordingly, any of the functionality of the systems 40, 42, 44, 46 may be implemented in hardware, software or a combination of both. Accordingly, the use of a processor 88a as a device and/or as a set of machine-readable instructions is hereafter referred to generically as a processor/module 88a for sake of simplicity.

For example, referring to FIG. 8, shown is an example operation 100 of the system 10 in conjunction with the components 40, 42, 44, 46, i.e. pick and place process combined with testing. The method 100 is for using a robotic system 11 to manipulate an electrical component 16a between a first location 20 and a second location 12, 26, the method comprising: engaging 102 the electrical component 16a by a manipulation tool 40 having one or more gripping elements 50, the electrical component 16a grabbed by the manipulation tool 40 at the first location 20 when the manipulation tool 40 is positioned adjacent to the electrical component 16a; translating 104 the manipulation tool 40 by a movement element 42 between the first location 20 and the second location 12,26; implementing 106 an electronic test of the electrical component 16a while the electrical component 16a is engaged by the manipulation tool the testing system 68 implementing the electronic test before the tested electrical component 16b is released; and disengaging 108 the manipulation tool 40 with the electrical component 16b upon reaching the second location 12, 26, thereby reversing the engaging. A further step 110 can be reading a unique ID 22 of the electrical component 16a,b by rotating the electrical component 16a,b once retained by the one or more gripping elements 50; wherein the electrical component 16a,b is rotated when the manipulation tool 40 is between the first location 20 and the second location 12,26; wherein rotation is about an axis 38 of the electrical component.

It is recognized that the rotation and reading of the EV battery cell 16a,16b can occur before or after (or during due to cycle time) the testing step, as desired (i.e. the cell 16a is rotated and the cell 16b is rotated).

An embodiment of the robotic system 10 is shown in FIGS. 9-14, demonstrating an operation thereof.

Only the basic principles and characteristics are described in the above embodiments, and is not limited to the above embodiments. Various modifications and changes may be made without departing from the spirit and scope of the present. These modifications and changes fall into the scope claimed to be protected. The scope to be protected is defined by the appended claims and equivalents thereof.

The invention claimed is:

1. A robotic system for manipulating an electrical component between a first location and a second location, the system comprising:
- a movement element for moving a manipulation tool between the first location and the second location;
- the manipulation tool having one or more gripping elements for engaging the electrical component by grabbing the electrical component at the first location when the manipulation tool is positioned adjacent to the electrical component;
- a testing system for implementing an electronic test of the electrical component while the electrical component is engaged by the manipulation tool, the testing system implementing the electronic test before the manipulation tool releases the electrical component;
- a gripping mechanism of the manipulation tool, the gripping mechanism having the one or more gripping elements having one or more gripping portions for engaging with a physical feature of the electrical component; and
- a retractable sleeve of the gripping mechanism, the retractable sleeve for inhibiting lateral movement relative to a longitudinal axis of the electrical component as the manipulation tool translates between the first location and the second location;
- wherein the manipulation tool is configured to disengage with the electrical component upon reaching the second location, thereby reversing said engaging.

2. The system of claim 1 further comprising a reader system for reading a unique ID of the electrical component and an actuation system for rotating the electrical component once retained by the one or more gripping elements; wherein the actuation system rotates the electrical component when the manipulation tool is between the first location and the second location in order to determine the unique ID; wherein rotation is about an axis of the electrical component.

3. The system of claim 1, wherein the electrical component is an EV battery cell.

4. The system of claim 1, wherein the first location is a container containing the electrical component amongst a plurality of electrical components.

5. The system of claim 1, wherein the second location is a disposal bin.

6. The system of claim 1, wherein second location is an electronics module assembly for receiving the electrical component.

7. The system of claim 6, wherein the electronics module assembly is a EV battery block containing a plurality of receptacles for the electrical component as an EV battery cell.

8. The system of claim 1, wherein testing system performs circuit testing of the electrical component as an EV battery cell.

9. The system of claim 2, wherein the reader system is a barcode scanner and the unique ID is a barcode.

10. The system of claim 1 further comprising a controller for controlling operation of any of the movement element, the manipulation tool and the testing system.

11. The system of claim 10, wherein the movement element is one or more articulated arms coupled with the manipulation tool as an end of arm tool.

12. The system of claim 2 further comprising a controller for controlling operation of any of the reader system and the actuation system.

13. The system of claim 2, wherein the actuation system includes a rotary motor for providing said rotating.

14. The system of claim 13, wherein the actuation system and the reader system are mounted on a frame of the manipulation tool.

15. The system of claim 1, wherein the one or more gripping elements are hooks and the physical feature is a groove in a body of the electrical component adjacent to a conductive end of the body, the electrical component is an EV battery cell.

16. A method for using a robotic system to manipulate an electrical component between a first location and a second location, the method comprising:
- engaging the electrical component by a manipulation tool having one or more gripping elements having one or more gripping portions for engaging with a physical feature of the electrical component, the electrical component grabbed by the one or more gripping portions at the first location when the manipulation tool is positioned adjacent to the electrical component;
- translating the manipulation tool by a movement element between the first location and the second location while using a retractable sleeve of the gripping mechanism, the retractable sleeve for inhibiting lateral movement relative to a longitudinal axis of the electrical component as the manipulation tool translates between the first location and the second location;
- implementing an electronic test of the electrical component while the electrical component is engaged by the manipulation tool before releasing the electrical component; and
- disengaging the manipulation tool with the electrical component upon reaching the second location, thereby reversing said engaging.

17. The method of claim 16 further comprising reading a unique ID of the electrical component by rotating the electrical component once retained by the one or more gripping elements; wherein the electrical component is rotated when the manipulation tool is between the first location and the second location; wherein rotation is about an axis of the electrical component.

18. The method of claim 16, wherein the electrical component is an EV battery cell.

\* \* \* \* \*